(12) United States Patent
Humiston et al.

(10) Patent No.: US 10,934,440 B2
(45) Date of Patent: Mar. 2, 2021

(54) ELECTRICALLY CONDUCTIVE, TRANSPARENT, TRANSLUCENT, AND/OR REFLECTIVE MATERIALS

(71) Applicant: CELGARD, LLC, Charlotte, NC (US)

(72) Inventors: Karl F. Humiston, Tucson, AZ (US); Kristoffer K. Stokes, Lunenburg, MA (US)

(73) Assignee: Celgard, LLC, Charlotte, NC (US)

( * ) Notice: Subject to any disclaimer, the term of this patent is extended or adjusted under 35 U.S.C. 154(b) by 177 days.

(21) Appl. No.: 16/031,003

(22) Filed: Jul. 10, 2018

(65) Prior Publication Data

US 2018/0327612 A1    Nov. 15, 2018

Related U.S. Application Data

(62) Division of application No. 14/687,131, filed on Apr. 15, 2015, now Pat. No. 10,030,157.

(60) Provisional application No. 61/979,564, filed on Apr. 15, 2014.

(51) Int. Cl.
*C23C 14/20* (2006.01)
*C09D 5/24* (2006.01)

(52) U.S. Cl.
CPC ............... *C09D 5/24* (2013.01); *C23C 14/20* (2013.01); *C08J 2323/06* (2013.01); *C08J 2323/12* (2013.01)

(58) Field of Classification Search
CPC ...................................................... C09D 5/24
USPC ...................................................... 428/195.1
See application file for complete search history.

(56) References Cited

U.S. PATENT DOCUMENTS

| | | |
|---|---|---|
| 3,953,566 A | 4/1976 | Gore |
| 5,048,283 A | 9/1991 | Moritz et al. |
| 6,057,061 A | 5/2000 | Callahan et al. |
| 6,080,507 A | 6/2000 | Yu |
| 2005/0083307 A1 | 4/2005 | Aufderheide |
| 2007/0080477 A1 | 4/2007 | Karttunen |
| 2007/0196638 A1 | 8/2007 | Wei et al. |
| 2008/0284925 A1 | 11/2008 | Han |

(Continued)

FOREIGN PATENT DOCUMENTS

| | | |
|---|---|---|
| JP | 2001-126539 A | 5/2001 |
| JP | 3491713 B2 | 1/2004 |
| JP | 2005038687 | 2/2005 |

(Continued)

OTHER PUBLICATIONS

"Applications of Polyhedral Oligomeric Silsequioxanes," DeArmitt, (p. 212), (2011).

(Continued)

*Primary Examiner* — Ian A Rummel
(74) *Attorney, Agent, or Firm* — Hammer & Associates, P.C.

(57) ABSTRACT

In one aspect, microporous membranes are described herein demonstrating composite architectures and properties suitable for electronic and/or optical applications. In some embodiments, a composite membrane described herein includes a microporous polymeric matrix or substrate having an interconnected pore structure and an index of refraction and an electrically conductive coating deposited over one or more surfaces of the microporous polymeric matrix. In other embodiments, the pores are filled and the membranes are substantially transparent.

24 Claims, 11 Drawing Sheets

(56) References Cited

U.S. PATENT DOCUMENTS

2010/0156810 A1* 6/2010 Barbier .................. G06F 3/044
                                                        345/173
2011/0223486 A1   9/2011 Zhang et al.

FOREIGN PATENT DOCUMENTS

| JP | 2008105402       | 5/2008  |
| JP | 2011-037978 A    | 2/2011  |
| JP | S5462973         | 1/2014  |
| JP | 2014040035       | 3/2014  |
| KR | 10-2011-0138862 A | 12/2011 |

OTHER PUBLICATIONS

"Polypropylene Material Information" as downloaded from http://www.goodfellowusa.com/A/Polypropylene.html on Feb. 17, 2016.
Machine translation of Hara, JP2001126539.

\* cited by examiner

ELECTRICALLY CONDUCTIVE, TRANSPARENT, TRANSLUCENT, AND/OR REFLECTIVE MATERIALS

CROSS-REFERENCE TO RELATED APPLICATIONS

This application claims benefit of and priority to U.S. patent application Ser. No. 14/687,131 filed Apr. 15, 2015, now U.S. patent Ser. No. 10/030,157, which claimed the benefit and priority to U.S. Provisional Application No. 61/979,564 filed Apr. 15, 2014, both of which are hereby incorporated herein by reference in its entirety.

FIELD

In accordance with at least selected embodiments, the present invention relates to conductive, transparent, translucent, and/or reflective polymeric membranes or materials, substrates for such membranes or materials, methods of production of such substrates, membranes or materials, and/or methods of use of such substrates, membranes or materials. In accordance with at least selected embodiments, the present invention relates to electrically conductive membranes or materials, preferably electrically conductive transparent membranes or materials, new or improved porous or microporous substrates for such membranes, methods of production of such conductive membranes or materials, and/or methods of use of such membranes, materials or substrates.

BACKGROUND

Microporous membranes have been extensively studied and developed for various separation and/or diffusion applications. Microporous membranes, for example, are widely used in air and water filtration applications as well as separator films in battery constructions. Various single or multiple layer Celgard® microporous polymeric membranes are manufactured and marketed by Celgard, LLC of Charlotte, N.C.

Typically, the insulative properties and organic construction of many microporous membranes often renders them unsuitable for electrically conductive applications and applications involving high temperature, oxidative, and other corrosive environments.

SUMMARY

In accordance with at least selected embodiments, the present invention may address the above need for microporous membranes suitable for electrically conductive applications and/or applications involving high temperature, oxidative, and/or other corrosive environments, and/or relates to conductive, transparent, translucent, partially reflective, and/or reflective polymeric membranes or materials, substrates for such membranes or materials, methods of production of such substrates, membranes and/or materials, and/or methods of use of such substrates, membranes and/or materials. In accordance with at least selected embodiments, the present invention relates to electrically conductive membranes or materials, preferably electrically conductive transparent or semi-transparent membranes or materials, new or improved porous or microporous substrates for such membranes, methods of production of such conductive membranes or materials, and/or methods of use of such membranes, materials or substrates.

In one aspect, membranes or microporous membranes are described herein demonstrating composite architectures and properties suitable for electronic and/or optical applications. In some embodiments, a composite membrane described herein includes or comprises a microporous polymeric matrix or substrate having an interconnected pore structure and an index of refraction and an electrically conductive coating deposited over one or more surfaces of the microporous polymeric matrix. The composite membrane can further include or comprise filler material in the pore structure of the polymeric matrix or substrate, the filler material preferably having an index of refraction substantially matching the index of refraction of the polymeric matrix. Further, composite membranes having constructions described herein can be transparent or substantially transparent.

In another aspect, optoelectronic devices are provided incorporating composite membranes described herein. In some embodiments, an optoelectronic device is a touch-screen device comprising a display and a composite membrane positioned over the display, the composite membrane preferably including or comprising a microporous polymeric matrix or substrate having an interconnected pore structure and an index of refraction. An electrically conductive coating is deposited over one or more surfaces of the microporous polymeric matrix. In being positioned over the display, the composite membrane can be or can be made to be transparent or substantially transparent.

In a further aspect, methods of making composite membranes are described herein. A method of making a composite membrane, in some embodiments, comprises providing a microporous polymeric matrix or substrate having an interconnected pore structure and an index of refraction and depositing an electrically conductive coating or material over one or more surfaces of the microporous matrix. Further, filler material can be deposited in the pore structure of the polymeric matrix, the filler material having an index of refraction substantially matching the index of refraction of the polymeric matrix. Such filler material can be added before, during or after deposition of the conductive or reflective coating or material.

These and other aspects, objects or embodiments are described in greater detail in the detailed description which follows.

DETAILED DESCRIPTION

Figure 1:
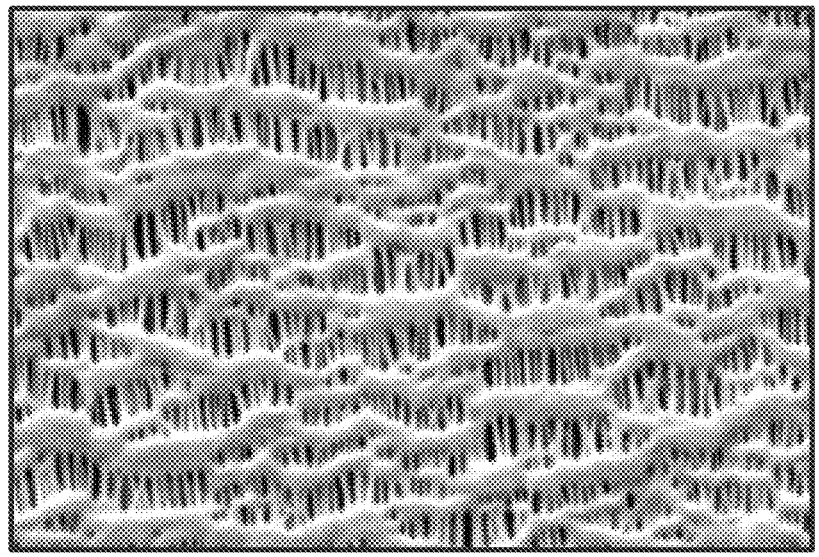
FIG. 1 is a surface scanning electron microscopy (SEM) image of a microporous polymeric matrix or substrate according to one embodiment described herein.

Embodiments described herein can be understood more readily by reference to the following detailed description and examples and their previous and following descriptions. Elements, apparatus and methods described herein, however, are not limited to the specific embodiments presented in the detailed description and examples. It should be recognized that these embodiments are merely illustrative of the principles of the present invention. Numerous modifications and adaptations will be readily apparent to those of skill in the art without departing from the spirit and scope of the invention.

Composite membranes described herein may demonstrate constructions permitting their use in a variety of applications, including electronic device and optical applications. A composite membrane described herein preferably comprises a microporous polymeric matrix, substrate or film having an interconnected pore structure and an index of refraction and an electrically conductive coating deposited over one or more surfaces of the microporous polymeric matrix. The composite membrane can further comprise filler material in the pore structure of the polymeric matrix, the filler material having an index of refraction substantially matching the index of refraction of the polymeric matrix.

Turning now to specific components, a preferred composite membrane comprises a microporous polymeric matrix or substrate having an interconnected pore structure. The microporous matrix can be fabricated from a variety of polymeric materials. For example, the microporous matrix can be formed of one or more polyolefins (POs), including polyethylene (PE), polypropylene (PP) or copolymers thereof. Alternatively, the microporous matrix can be formed of polyamide, polyester, polysulfone such as polyethersulfone (PES), cellulose or fluoropolymer including polyvinylidene fluoride (PVDF), polyvinyl fluoride (PVF) and/or polytetrafluoroethylene (PTFE).

In addition to polymeric composition, the microporous matrix can demonstrate various physical constructions and morphologies. In some embodiments, the microporous matrix is formed of a single layer of polymeric material yielding a monolayer construction. Alternatively, the microporous matrix can comprise multiple layers of polymeric material. Any number of polymeric layers not inconsistent with the objectives of the present invention can be used to provide a microporous matrix. The microporous matrix, for example, can display a bilayer, trilayer or multilayer construction. Table I provides various non-limiting constructions for microporous polymeric matrices of composite membranes described herein.

TABLE I

| Selected, Non-Limiting Microporous Polymeric Matrix Constructions | | | |
|---|---|---|---|
| Monolayer | Bilayer | Trilayer | Multilayer |
| PP | PP/PP | PP/PP/PP | PP/PP/PP/PP |
| PE | PE/PE | PE/PE/PE | PE/PE/PE/PE |
| PP-PE Blend | PP/PE | PP/PE/PP | PP/PP/PP/PE |
| PP-PE copolymer | PE/PP | PP/PP/PE | PP/PP/PE/PE |
| | PP-PE Blend/PP | PE/PP/PE | PP/PE/PE/PE |
| | PP-PE Copolymer/PP | PE/PE/PP | PE/PP/PP/PP |
| | PP-PE Blend/PE | PP/PP-PE Blend/PP | PE/PE/PP/PP |
| | PP-PE Copolymer/PE | PP/PP-PE Copolymer/PP | PE/PE/PE/PP |
| | PP/PP-PE Blend | PP/PP/PP-PE Blend | PP/PE/PP/PP |
| | PP/PP-PE Copolymer | PP/PP/PP-PE Copolymer | PP/PP/PE/PP |
| | PE/PP-PE Blend | PE/PP-PE Blend/PE | PP/PE/PP/PP |
| | PE/PP-PE Copolymer | PE/PP-PE Copolymer/PE | PE/PP/PE/PE |
| | | PE/PE/PP-PE Blend | PE/PE/PP/PE |
| | | PE/PE/PP-PE Copolymer | PE/PP/PP/PE |
| | | PP/PE/PP-PE Blend | PP/PP/PP/PP-PE Blend |
| | | PP/PE/PP-PE Copolymer | PP/PP/PP/PP-PE Copolymer |

TABLE I-continued

Selected, Non-Limiting Microporous Polymeric Matrix Constructions

| Monolayer | Bilayer | Trilayer | Multilayer |
|---|---|---|---|
| | | PE/PP/PP-PE Blend | PP/PP/PP-PE Blend/PP |
| | | PE/PP/PP-PE Copolymer | PP/PP/PP-PE Copolymer/PP |
| | | PP/PP-PE Blend/PE | PP/PP-PE Blend/PP/PP |
| | | PP/PP-PE Copolymer/PE | PP/PP-PE Copolymer/PP/PP |
| | | PE/PP-PE Blend/PP | PP-PE Blend/PP/PP/PP |
| | | PE/PP-PE Blend/PP | PP-PE Copolymer/PP/PP/PP |
| | | | PE/PE/PE/PP-PE Blend |
| | | | PE/PE/PE/PP-PE Copolymer |
| | | | PE/PE/PP-PE Blend/PE |
| | | | PE/PE/PP-PE Copolymer/PE |
| | | | PE/PP-PE Blend/PE/PE |
| | | | PE/PP-PE Copolymer/PE/PE |
| | | | PP-PE Blend/PE/PE/PE |
| | | | PP-PE Copolymer/PE/PE/PE |
| | | | PP/PP/PE/PP-PE Blend |
| | | | PP/PP/PE/PP-PE Copolymer |
| | | | PP/PP/PP-PE Blend/PE |
| | | | PP/PP/PP-PE Copolymer/PE |
| | | | PP/PP-PE Blend/PP/PE |
| | | | PP/PP-PE Copolymer/PP/PE |
| | | | PP-PE Blend/PP/PP/PE |
| | | | PP-PE Copolymer/PP/PP/PE |
| | | | PP/PE/PE/PP-PE Blend |
| | | | PP/PE/PE/PP-PE Copolymer |
| | | | PP/PE/PP-PE Blend/PE |
| | | | PP/PE/PP-PE Copolymer/PE |
| | | | PP/PP-PE Blend/PE/PE |
| | | | PP/PP-PE Copolymer/PE/PE |
| | | | PP-PE Blend/PP/PE/PE |
| | | | PP-PE Copolymer/PP/PE/PE |
| | | | PE/PE/PP/PP-PE Blend |
| | | | PE/PE/PP/PP-PE Copolymer |
| | | | PE/PE/PP-PE Blend/PP |
| | | | PE/PE/PP-PE Copolymer/PP |
| | | | PE/PP-PE Blend/PE/PP |
| | | | PE/PP-PE Copolymer/PE/PP |
| | | | PP-PE Blend/PE/PE/PP |
| | | | PP-PE Copolymer/PE/PE/PP |

Polymeric layers of microporous matrices described herein can also demonstrate various morphologies. In some embodiments, morphology of a polymeric layer is induced by the process in which the layer is formed. For example, a polymeric layer can be formed of a dry stretch process where pore formation results from stretching a nonporous, semicrystalline extruded polymer composition in the machine direction (MD). FIG. 1 is an SEM image of a microporous polymeric matrix formed of a monolayer of polypropylene subjected to the dry-stretch process. As illustrated in FIG. 1, this particular polypropylene matrix demonstrates an interconnected pore structure of elongated or slit-like geometry. The interconnected pore structure is continuous with the thicker, fiber-like polypropylene structures of the matrix.

Figure 2:
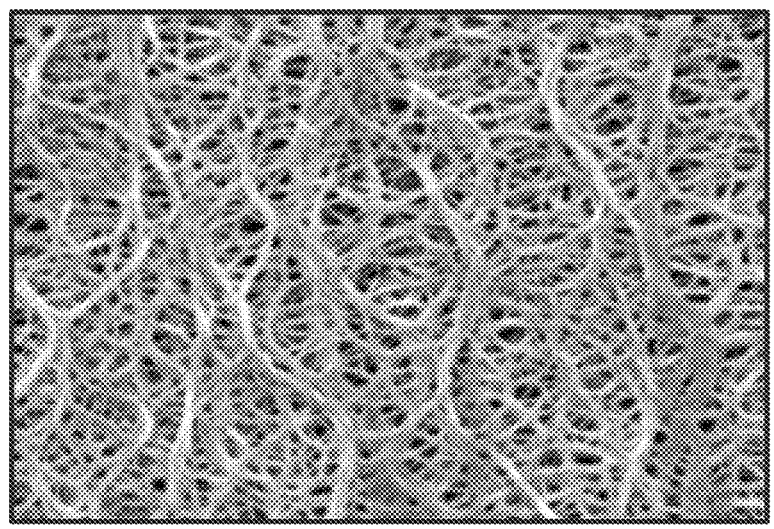
FIG. 2 is a surface SEM image of a microporous polymeric matrix according to another embodiment described herein.

A polymeric layer can also be formed from a wet process or phase inversion process where a polymeric composition is mixed with a plasticizer and extruded. Pore formation in the polymeric material is induced by removal of the plasticizer. The polymeric material may also be stretched in MD and/or transverse machine (TD) direction. FIG. 2 is an SEM image of a microporous polymeric matrix formed of a monolayer of polyethylene subjected to wet processing. The polyethylene matrix also demonstrates an interconnected pore structure continuous with fiber-like polyethylene structures. In contrast to the image shown in FIG. 1, the pores shown in FIG. 2 have rounder geometries. However, there are polymer matrix materials formed from dry-stretch processes today (for examples, processes that involve biaxial stretching of a nonporous precursor) that also have pores having rounder geometries. In FIG. 2, there is increased overlap of the polyethylene fiber structures, as compared with FIG. 1, producing a lace-like appearance.

Figure 3:
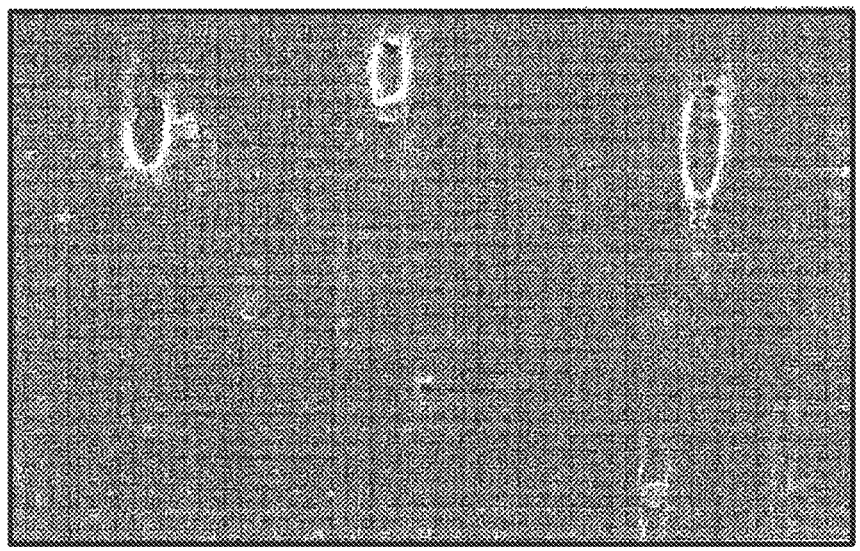
FIG. 3 is a surface SEM image of a microporous polymeric matrix according to yet another embodiment described herein.

Additionally, a polymeric layer can be formed by a particle stretch process whereby a polymeric composition is mixed with particles and extruded. Pores are formed in the polymeric composition during stretching when interfaces between the polymeric composition and particles fracture. Formation of porous polymeric layer(s) by particle stretch processes is further detailed in U.S. Pat. Nos. 6,057,061 and 6,080,507 which are incorporated herein by reference in their entireties. FIG. 3 is an SEM image of a microporous polymeric matrix formed of a monolayer of polypropylene subjected to particle stretch processes. As illustrated in FIG. 3, the matrix adopts an interconnected oval pore structure resulting from MD stretching.

Further, polymeric matrices of composite membranes described herein can demonstrate biaxially oriented porous architectures, such as those described in United States Published Patent Application 2007/0196638 and U.S. patent application Ser. No. 13/044,708 which are each incorporated herein by reference in their entirety. Also, non-stretched porous membranes, such as cast membranes, woven or non-woven layers, and the like, may be used.

Figure 4:
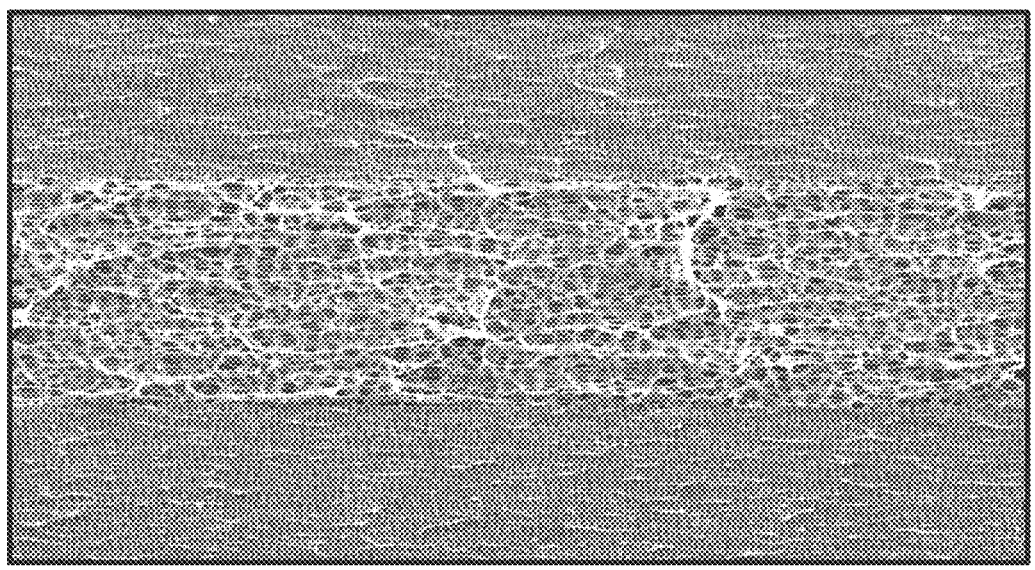
FIG. 4 is a cross-sectional SEM image of a microporous polymeric matrix comprising a multilayer structure illustrating compositional and morphological gradients according to one multilayer embodiment described herein.

As set forth above, a microporous polymeric matrix can be formed of multiple polymeric layers. In some embodiments, the polymeric layers demonstrate similar morphologies as they are each formed by the same dry-stretch process, wet process or particle stretch process. Alternatively, polymeric layers can display mixed morphologies wherein one or more layers are formed by different processes. Embodiments herein contemplate any combination of polymeric layers formed by dry-stretch, particle stretch and wet processes. For example, individual layers of the constructions provided in Table I can demonstrate varying morphologies selected from those produced by dry stretch, particle stretch and wet processes. Therefore, polymeric matrices of composite membranes described herein can display compositional and morphological gradients. FIG. 4 is a cross-sectional SEM of a microporous polymeric matrix comprising a multilayer structure illustrating compositional and morphological gradients according to one embodiment. The microporous matrix of FIG. 4 has a PP/PE/PP structure, wherein the PE layer demonstrates a divergent morphology from the sandwiching PP layers. Individual polymeric layers of a microporous matrix described herein can be coupled by several techniques including lamination, coextrusion or other bonding mechanism.

In addition to the foregoing architectures, a microporous polymeric matrix can also demonstrate various non-woven constructions including spunbond, spunmelt, meltblown, spunlace, or the like.

In some embodiments, a microporous polymeric matrix has an average pore size ranging from 0.010 μm to 50 μm, in some embodiments, from 0.1 μm to 1.0 μm, and in some embodiments, from 0.1 μm to 0.6 μm. Further, a microporous polymeric matrix can have a thickness according to Table II.

TABLE II

| Microporous Polymeric Matrix Thickness (μm) |
|---|
| 1-100 |
| 2-40 |
| 4-30 |
| 5-20 |
| 6-12 |

Additionally, a microporous matrix can have porosity in excess of 40 percent. In some embodiments, a microporous membrane has a porosity of 40-95 percent.

As described herein, a microporous polymeric matrix of a composite membrane has an index of refraction. In some embodiments, a microporous polymeric matrix can have an index of refraction ranging from about 1.40 to about 1.60, and in some embodiments, from about 1.48 to 1.52. For example, a microporous membrane formed of polypropylene can display an index of refraction of 1.49 while a microporous membrane formed of polyethylene can display a refractive index of 1.50. When a microporous matrix is formed of multiple polymeric layers, the polymeric layers can have the same or substantially similar refractive indices.

In addition to a microporous polymeric matrix, a preferred composite membrane described herein comprises an electrically conductive coating deposited over one or more surfaces of the microporous matrix. The electrically conductive coating can coat one or both sides of the microporous polymeric matrix. Further, the electrically conductive coating, in some embodiments, penetrates into the pore structure of the matrix, coating surfaces of the pore structure. In coating pore surfaces, the pore structure of the polymeric matrix is maintained and not occluded by the electrically conductive coating. In some embodiments, the electrically conductive coating is on the molecular scale having a thickness on the order of Angstroms or nanometers. Additionally, the electrically conductive coating can be patterned on one or more surfaces of the microporous polymeric matrix.

The electrically conductive coating can comprise any electrically conductive material not inconsistent with the objectives of the present invention. The electrically conductive coating can be formed of a metal or alloy composition. In one embodiment, the electrically conductive coating is selected from the group consisting of aluminum, copper, nickel, gold, other noble metals and alloys thereof. Moreover, the electrically conductive coating can be formed of a light transmissive conducting oxide including indium tin oxide (ITO), gallium indium tin oxide (GITO), zinc indium tin oxide (ZITO), fluorine doped tin oxide or doped zinc oxide. Alternatively, the electrically conductive coating can be provided as an organic material. Electrically conductive organic materials such as graphite, graphene, carbon nanoparticles and/or electrically conductive polymeric species can be used to provide the electrically conductive layer. Electrically conductive polymeric species can include intrinsically conductive polymers, which may be doped, and which may include, but are not limited to, poly(thiophenes), poly(paraphenylenes), polydiacetylenes, polyacetylenes, poly(paraphenylenevinylenes), polyaniline and derivatives thereof.

Compositional identity of the electrically conductive layer can be selected according to several considerations including desired conductivity of the layer and/or desired optical properties of the composite membrane. In some embodiments, the electrically conductive layer provides a sheet resistivity of 1-500 Ω/sq or less, or in some embodiments, 1-20 ohm/sq.

A composite membrane described herein can further comprise filler material in the pore structure of the microporous polymeric matrix, the filler material preferably having an index of refraction substantially matching the index of refraction of the polymeric matrix. In some embodiments, the filler material is added to the pore structure of the microporous polymeric matrix to provide the composite membrane the desired optical clarity properties. Addition of the filler material, for example, can further enhance the optical clarity of the composite membrane rendering the membrane transparent or substantially transparent.

In embodiments wherein the microporous matrix is formed of multiple polymeric layers, the polymeric layers can be substantially index matched, thereby permitting the refractive index of the filler material to match or substantially match each of the polymeric layers. For example, PP and PE layers of a multilayer construction can be index matched permitting compatibility of each layer with the refractive index of the filler material.

Suitable filler material having the requisite refractive index can be solid or semi-solid. In some embodiments, for example, filler material is an adhesive, in some embodiments, optical adhesive filler material. In addition to imparting desired optical properties, adhesive filler material can facilitate incorporation of composite membranes described herein into various optoelectronic devices, including touchscreen devices. Filler material can be incorporated into the interconnected pore structure of the microporous polymeric matrix by several techniques. Filler material, in some embodiments, is flowed into the pore structure followed by hardening or increasing the viscosity of the filler to a substantially non-flowable state.

Composite membranes described herein, in some embodiments, exhibit an optical transparency of at least about 90 percent or at least about 95 percent between 450 nm and 750 nm (wavelengths covering the visible spectrum of light). Further, composite membranes described herein, in some embodiments, are flexible. Flexibility of the composite membranes can permit their use in flexible optoelectronic devices including flexible touchscreen devices.

In another aspect, optoelectronic devices are provided incorporating composite membranes described herein. In some embodiments, an optoelectronic device is a touchscreen device comprising a display and a composite membrane positioned over the display, the composite membrane comprising a microporous polymeric matrix having an interconnected pore structure and an index of refraction. An electrically conductive coating is (or multiple coatings are) deposited over one or more surfaces of the microporous polymeric matrix. The composite membrane can further comprise filler material having an index of refraction substantially matching the index of refraction of the polymeric matrix. Alternatively, filler material can be chosen to have a refractive index substantially matching a glass lens or covering the touch screen device. Thus, in some embodiments, depending on optical preferences, the refractive index of the filler material may be chosen to be closer to that of the polymer in the microporous polymeric matrix, or closer to that of the material making up the glass lens or covering for the touch screen or device or the like. Matching refractive indices of the filler material and glass component of the touch screen device can enhance anti-reflective properties. A composite membrane positioned over the display can have any construction and/or properties described herein. Also, there can be one or more composite membrane layers. For example, both capacitive and resistive touch screens use two layers of clear conductive material.

A touchscreen device can refer to any of a number of display and/or control screens that can be operated by touching the display area of the screen, including with a finger or stylus. For example, a touch screen can include a resistive touch screen, a surface capacitive touch screen, a projected capacitive touch (PCT) touch screen, a surface acoustic waves (SAW) touch screen, an infrared grid touch screen, an optical imaging touch screen, a dispersive signal technology touch screen or an acoustic pulse recognition touch screen. A capacitive touch screen can be a mutual capacitance or self-capacitance touch screen. Moreover, a touch screen can be a single-touch or multi-touch screen.

A composite membrane described herein can provide various properties to the touch screen device. For example, in some implementations, a composite membrane described herein functions as a protective coating for the touch screen device or for a component of the touch screen device. In other implementations, a composite membrane functions as an electrically conductive layer or as a conductive coating. In some cases, electrical conduction can occur in the plane of a composite membrane. Further, a composite membrane described herein can be used in a touch screen architecture as a replacement for a transparent conductive material, such as a glass substrate coated with indium tin oxide (ITO). In some implementations described herein, a composite membrane functions as both a protective coating and a conductive layer or conductive coating. Using a composite membrane as a protective coating and/or an electrically conductive layer or coating can provide resistance to damage from external moisture, oils, dirt, or dust to a touch screen. Further, in some embodiments, a composite membrane can provide one or more of the foregoing advantages while also exhibiting optical transparency and/or in-plane electrical conductivity.

In a further aspect, methods of making composite membranes are described herein. A method of making a composite membrane, in some embodiments, comprises providing a microporous polymeric matrix having an interconnected pore structure and an index of refraction and depositing an electrically conductive coating over one or more surfaces of the microporous matrix. Further, filler material can be deposited in the pore structure of the polymeric matrix, the filler material having an index of refraction substantially matching the index of refraction of the polymeric matrix. A composite membrane produced in accordance with methods described herein can have any construction and/or properties detailed above.

A microporous polymeric matrix having an interconnected pore structure can be provided according to dry-stretch, particle stretch or wet processes described above. Moreover, multiple porous polymeric layers produced by such processes can be combined to provide a multilayer microporous polymeric matrix.

Deposition of the electrically conductive coating can be administered according to several processes. In some embodiments, for example, a metal/alloy electrically conductive coating is deposited by one or more physical vapor deposition (PVD) techniques, such a thermal evaporation or sputtering. Moreover, organic electrically conductive coatings, in some embodiments, are spin cast onto the microporous polymeric matrix. As described herein, the electrically conductive coating can coat one or both sides of the microporous polymeric matrix. In some embodiments, the electrically conductive coating is patterned on one or more surfaces of the microporous polymeric matrix. Patterning can be administered by one or more lithographic, masking and/or screening techniques.

Further, the electrically conductive coating, in some embodiments, penetrates into the pore structure of the polymeric matrix, coating surfaces of the pore structure. In coating pore surfaces, the pore structure of the polymeric matrix is maintained and not occluded by the electrically conductive coating. In some embodiments, the electrically conductive coating is on the molecular scale having a thickness on the order of Angstroms or nanometers.

As described herein, filler material can be deposited in the pore structure of the polymeric matrix, the filler material having an index of refraction substantially matching the index of refraction of the polymeric matrix. In some embodiments, the filler material may have an index of refraction matching a glass lens or other optical component of an optoelectronic device.

In some embodiments, filler material is flowed into the pore structure and partially or fully solidified. Filler material can be deposited in the pore structure of the microporous polymeric matrix prior or subsequent to deposition of the electrically conductive coating. When placed in the pore structure prior to deposition of the electrically conductive coating, the filler material can be covered by the electrically conductive coating. Placement of filler material in the pore structure of the microporous polymeric matrix can preclude the electrically conductive coating from being deposited on surfaces of the pore structure. Alternatively, the electrically conductive coating can be deposited on surfaces of the pore structure prior to introduction of the filler material.

These and other embodiments are further illustrated by the following non-limiting examples.

Example 1

A Celgard 2500 microporous polypropylene matrix (25 µm thickness) is metalized on one side via a vapor deposition process with aluminum metal to a sheet resistivity of between 0-500 Ω/sq. The metallization can be performed with patterning (mask, silk screening, etc.) associated with touch screen addressing technologies. The metalized microporous matrix can now be used in conjunction with a filler material to obtain a composite membrane having the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 2

A Celgard 2500 microporous polypropylene matrix (25 μm thickness) is treated on one side via a vapor deposition process with ITO to a sheet resistivity of between 0-500 Ω/sq. The sputtering can be performed with patterning (mask, silk screening, etc.) associated with touch screen addressing technologies. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 3

A Celgard 2500 microporous polypropylene matrix (25 μm thickness) is metalized on two sides via a vapor deposition process with aluminum metal to a sheet resistivity of between 0-500 Ω/sq. The metallization can be performed with patterning (mask, silk screening, etc.) associated with touch screen addressing technologies. A two sided patterning can be used for a "one layer" capacitive touch screen construction. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 4

A Celgard 2500 microporous polypropylene matrix (25 μm thickness) is treated on two sides via a vapor deposition process with ITO to a sheet resistivity of between 0-500 Ω/sq. The sputtering can be performed with patterning (mask, silk screening, etc.) associated with touch screen addressing technologies. A two sided patterning can be used for a "one layer" capacitive touch screen construction. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 5

A Celgard EZ1590 microporous polypropylene matrix (15 μm thickness) is metalized on one side via a vapor deposition process with aluminum metal to a sheet resistivity of between 0-500 Ω/sq. The metallization can be performed with patterning (mask, silk screening, etc.) associated with touch screen addressing technologies. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 6

A Celgard EZ1590 microporous polypropylene matrix (15 μm thickness) is treated on one side via a vapor deposition process with ITO to a sheet resistivity of between 0-500 n/sq. The sputtering can be performed with patterning (mask, silk screening, etc.) associated with touch screen addressing technologies. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 7

A Celgard EZ1590 microporous polypropylene matrix (15 μm thickness) is metalized on two sides via a vapor deposition process with aluminum metal to a sheet resistivity of between 0-500 Ω/sq. The metallization can be performed with patterning (mask, silk screening, etc.) associated with touch screen addressing technologies. A two sided patterning can be used for a "one layer" capacitive touch screen construction. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 8

A Celgard EZ1590 microporous polypropylene matrix (15 μm thickness) is treated on two sides via a vapor deposition process with ITO to a sheet resistivity of between 0-500 Ω/sq. The sputtering can be performed with patterning (mask, silk screening, etc.) associated with touch screen addressing technologies. A two sided patterning can be used for a "one layer" capacitive touch screen construction. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 9

A Celgard K2045 microporous polyethylene matrix (20 μm thickness) is metalized on one side via a vapor deposition process with aluminum metal to a sheet resistivity of between 0-500 Ω/sq. The metallization can be performed with patterning (mask, silk screening, etc.) associated with touch screen addressing technologies. The pattern can be done on one or more surfaces of the polymeric matrix, including the surfaces of the pores. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 10

A Celgard K2045 microporous polyethylene membrane (20 µm thickness) is treated on one side via a vapor deposition process with ITO to a sheet resistivity of between 0-500 Ω/sq. The sputtering can be performed with patterning (mask, silk screening, etc.) associated with touch screen addressing technologies. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 11

A Celgard K2045 microporous polyethylene membrane (20 µm thickness) is metalized on two sides via a vapor deposition process with aluminum metal to a sheet resistivity of between 0-500 Ω/sq. The metallization can be performed with patterning (mask, silk screening, etc.) associated with touch screen addressing technologies. A two sided patterning can be used for a "one layer" capacitive touch screen construction. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 12

A Celgard K2045 microporous polyethylene membrane (20 µm thickness) is treated on two sides via a vapor deposition process with ITO to a sheet resistivity of between 0-500 Ω/sq. The sputtering can be performed with patterning (mask, silk screening, etc.) associated with touch screen addressing technologies. A two sided patterning can be used for a "one layer" capacitive touch screen construction. The metalized microporous matrix can now be used in conjunction with a filler material to obtain the desired optical clarity properties. In this case, an optical adhesive with a refractive index matching the polypropylene matrix (i.e. NOA 148 from Norland Products) can be used to simultaneously fill the matrix and provide adhesive properties to the touchscreen glass surface, as well as the supporting layers below.

Example 13

Any of the foregoing porous polymeric matrices can be conductively coated on one or both sides by the processes of thermal metallization, sputtering, chemical grafting, electroless plating, polymerization, etc.

Materials that can be used for conductivity are metals such as gold, silver, aluminum, nickel, copper, platinum, palladium, iron, etc. Furthermore, alloys of these and others may be used. ITO is particularly useful, as are other variants thereof (various doped zinc oxides or tin oxides). Inherently conductive polymers can also be patterned on the surface in a similar manner. Poly(thiophenes), poly(paraphenylenes), polydiacetylenes, polyacetylenes, poly(paraphenylenevinylenes), etc. are classes of conductive polymers that could be chemically grafted to the surface or patterned with a vapor deposition method or solution printing method to provide the requisite conductivities. Other materials such as carbon nanotubes, carbon fullerenes, and graphene may be conductive materials that could be used in the future.

Example 14

A microporous polymeric matrix that has been metalized or patterned with an electrically conductive surface on one or both sides can be included in a continuous process of manufacturing touch screens. A roll of metalized matrix can be patterned and shipped to a touch screen manufacturer. Said manufacturer can take the prepatterned roll and apply the film to a glass lens. This can be done directly from the roll and aligned very easily as the conductive substrate is opaque before filling/adhering.

After the alignment has occurred on the glass lens, application of a refractive index matching optical adhesive (matching either the refractive index of the porous matrix, or the selected glass lens) is applied to the back side of the film. Since the film is highly porous, the adhesive can be applied to only one side, allowed to seep through or forced through by a mechanical inducement, and can provide adhesion through the porous material simultaneously on two sides. In this manner, one adhesive step can be removed from the process.

In accordance with at least selected embodiments, aspects or objects, the present invention relates to polymeric membranes, to electrically conductive membranes, to electrically conductive transparent membranes, new or improved substrates for such membranes, methods of production of such membranes, and/or methods of use of such membranes or substrates.

In one aspect, microporous membranes are described herein demonstrating composite architectures and properties suitable for electronic and/or optical applications. In some embodiments, a composite membrane described herein includes a microporous polymeric matrix or substrate having an interconnected pore structure and an index of refraction and an electrically conductive coating deposited over one or more surfaces of the microporous polymeric matrix. In other embodiments, the pores are filled and the membranes are substantially transparent.

In accordance with at least certain embodiments, aspects or objects, the present invention relates to conductive, transparent, translucent, and/or reflective polymeric membranes or materials, substrates for such membranes or materials, methods of production of such substrates, membranes or materials, and/or methods of use of such substrates, membranes or materials. In accordance with at least certain selected embodiments, the present invention relates to electrically conductive membranes or materials, preferably electrically conductive transparent membranes or materials, new or improved porous or microporous substrates for such membranes, methods of production of such conductive membranes or materials, and/or methods of use of such membranes, materials or substrates.

The membrane and/or material may be conductive and/or reflective, for example, depending on the material deposited, the manner of deposition, if the pores remain open or unfilled, and/or the like. For example, in FIGS. 5 and 6, the metalized side was metalized, coated, treated or deposited with aluminum deposition on the surface of the porous film, matrix or substrate, and provides both conductivity and reflectivity (see the dull, mirror-like surface of the right side of FIG. 6, by way of example, where the pores of the membrane are not filled). If the aluminum were deposited in a pattern (such as parallel lines), there would be conductivity but perhaps no reflectivity. Also, certain non-conductive coating materials may provide reflectivity without conductivity. Also, the level of reflectivity and/or opaqueness versus the level of transparency and/or translucence can be modified or adjusted by filling pores with certain amounts of material having a certain refractive index.

Figure 5:
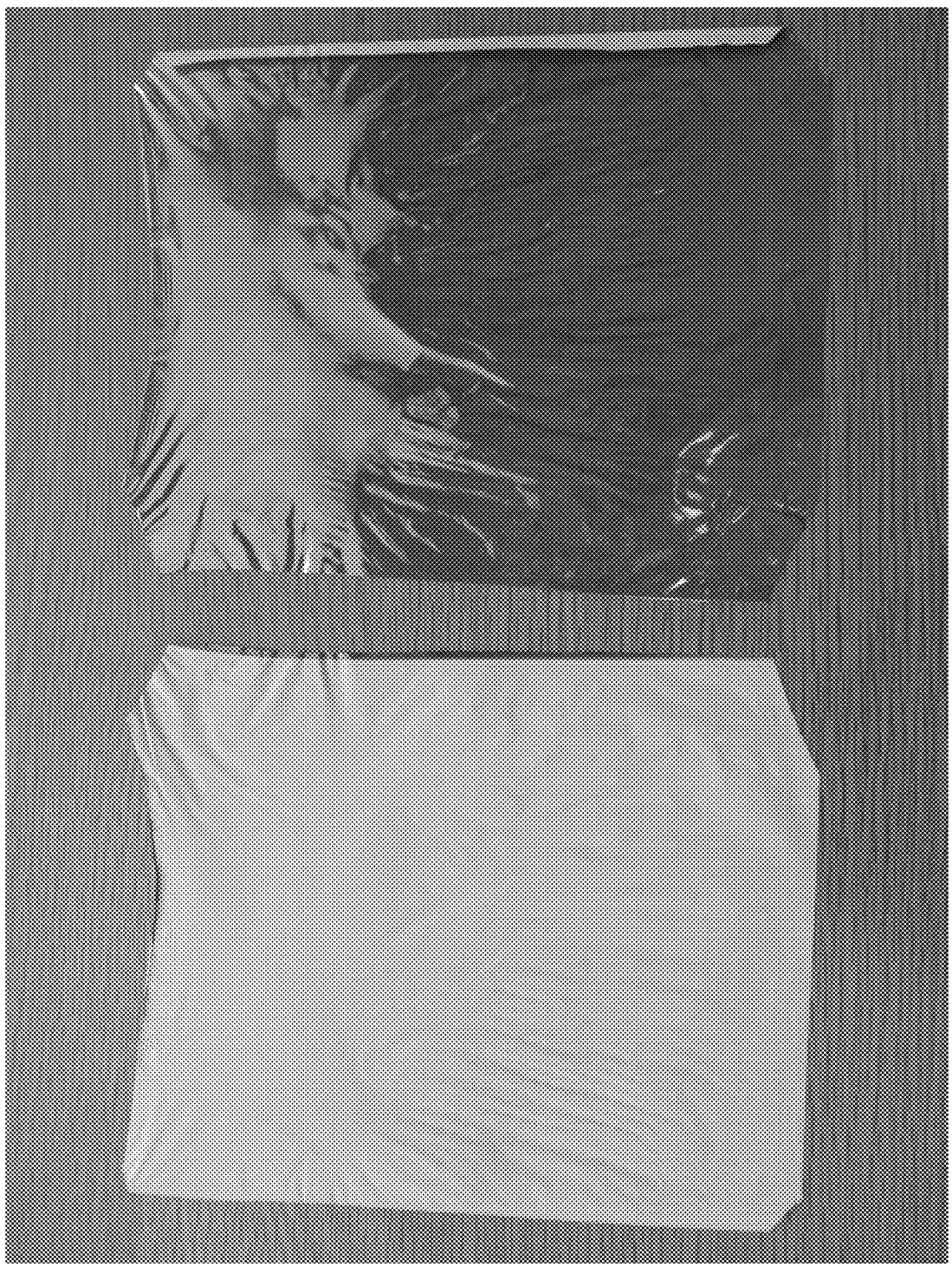
FIG. 5 includes photographic images showing side by side comparison of, on the left, the white uncoated (non-metalized) surface or side of a membrane and, on the right, the reverse, metallic, shiny or reflective side of the same metalized or coated membrane or material having a microporous polymeric matrix according to a particular embodiment of the present invention.
Figure 6:
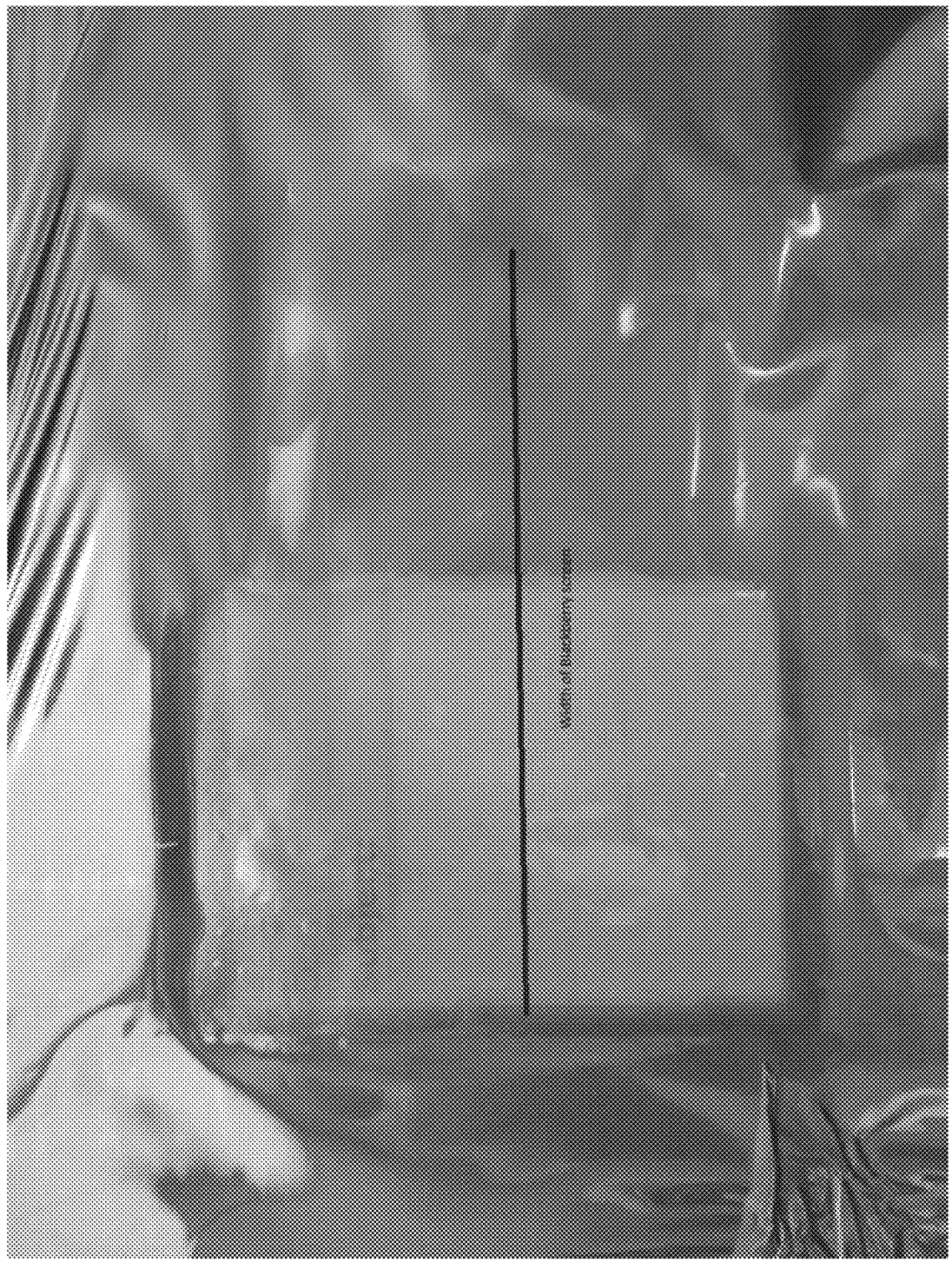
FIG. 6 is a photographic image of the metalized membrane or material of FIG. 5 placed over a display screen of a consumer electronic device, in particular, a BlackBerry device, with the filled portion of the metalized membrane or material (the portion on the left, through which the device screen shows) being transparent or translucent and the unfilled portion (the portion on the right, still over the device screen) being opaque and reflective without the device screen showing through the material in such portion.

FIG. 5 is a photographic image showing side by side comparison of the white uncoated (non-metalized) surface or side and the metallic, shiny or reflective side of a metalized or coated membrane or material (Celgard® EZ2090) having a microporous polymeric matrix according to a particular embodiment of the present invention. Although FIG. 5 shows only one side metalized, it is understood that one or both sides may be metalized and that the pores may be filled or unfilled. FIGS. 5, 7, 8 and 9 show unfilled pores. FIG. 6 shows a portion having filled pores. In accordance with the particular example of FIG. 6, the pores were filled with a hand sanitizer mixture having about 62% ethanol. One could also fill the pores of the membrane with oil, IPA, solvent, polymer, a polymer and solvent mixture, and/or the like, to make it clear or transparent. The preferred filler is one that works in the particular application and that makes the membrane clear or nearly clear when the pores of the membrane are filled with the filler material.

FIG. 6 is a photographic image of the metalized membrane or material of FIG. 5 (Celgard® EZ2090) placed over a display screen of a consumer electronic device, in particular, a BlackBerry device, with the filled portion of the metalized membrane or material being transparent or translucent and the unfilled portion being opaque and reflective.

Figure 7:
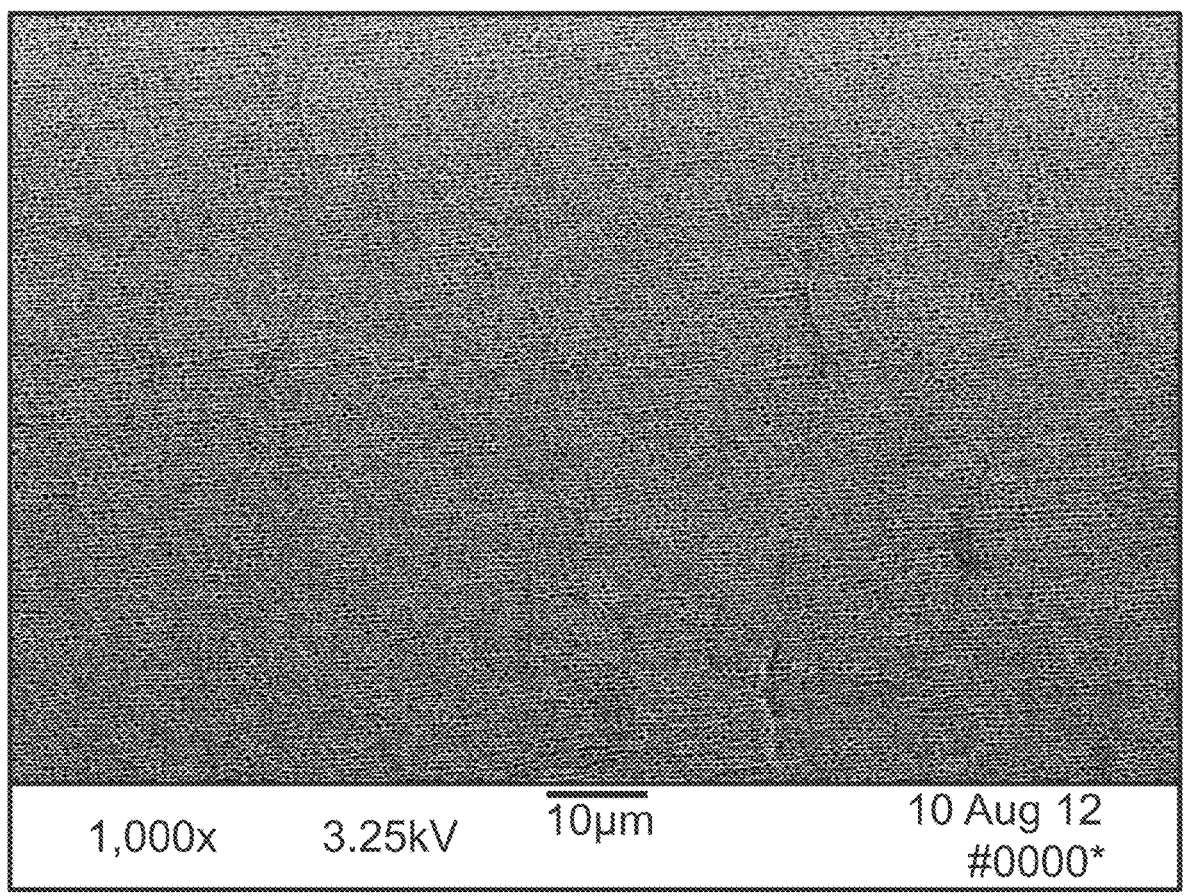
FIG. 7 is a surface SEM image of the metalized surface of the metalized membrane or material of FIG. 5 at 1,000× magnification.

FIG. 7 is a surface SEM of the metalized surface of the metalized membrane or material of FIG. 5 (Celgard® EZ2090) at 1,000× magnification.

Figure 8:
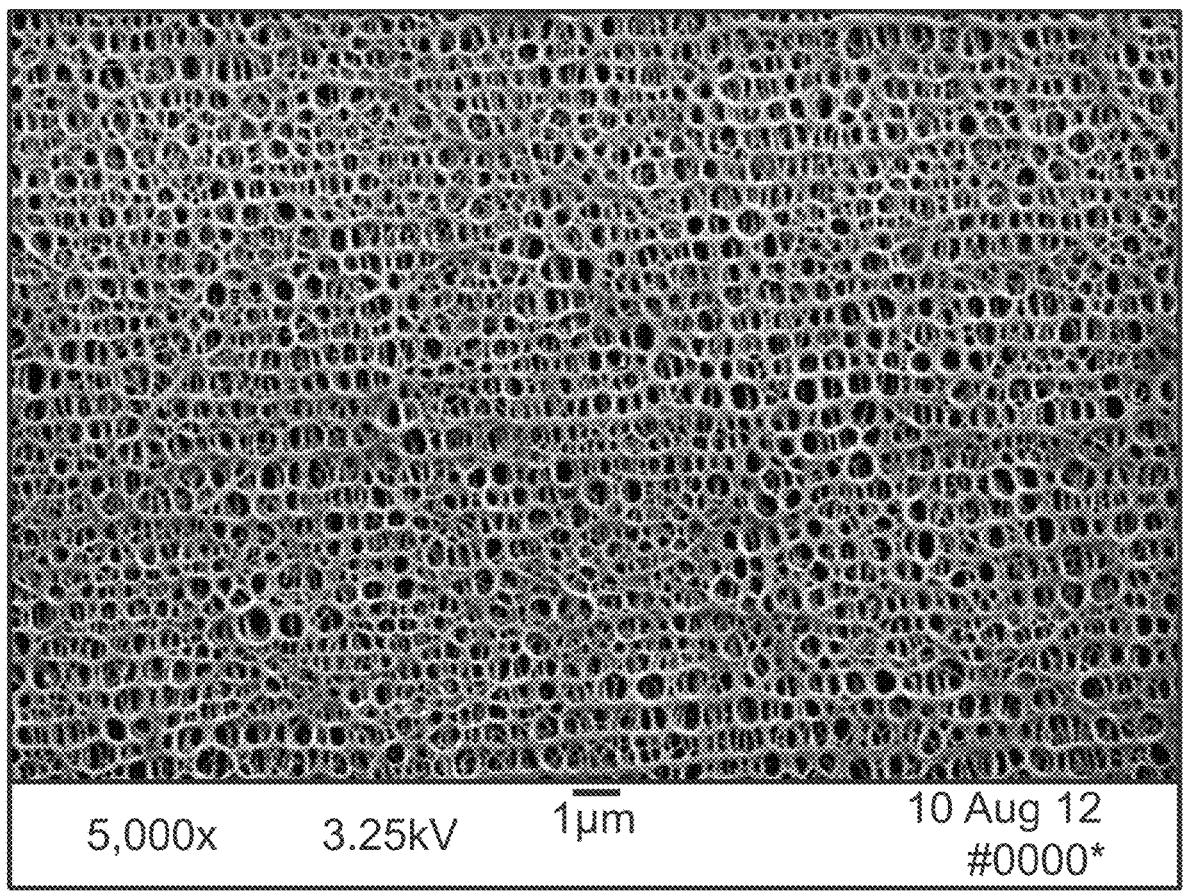
FIG. 8 is a surface SEM image of the metalized surface of the metalized membrane or material of FIG. 5 at 5,000× magnification.

FIG. 8 is a surface SEM of the metalized surface of the metalized membrane or material of FIG. 5 at 5,000× magnification.

Figure 9:
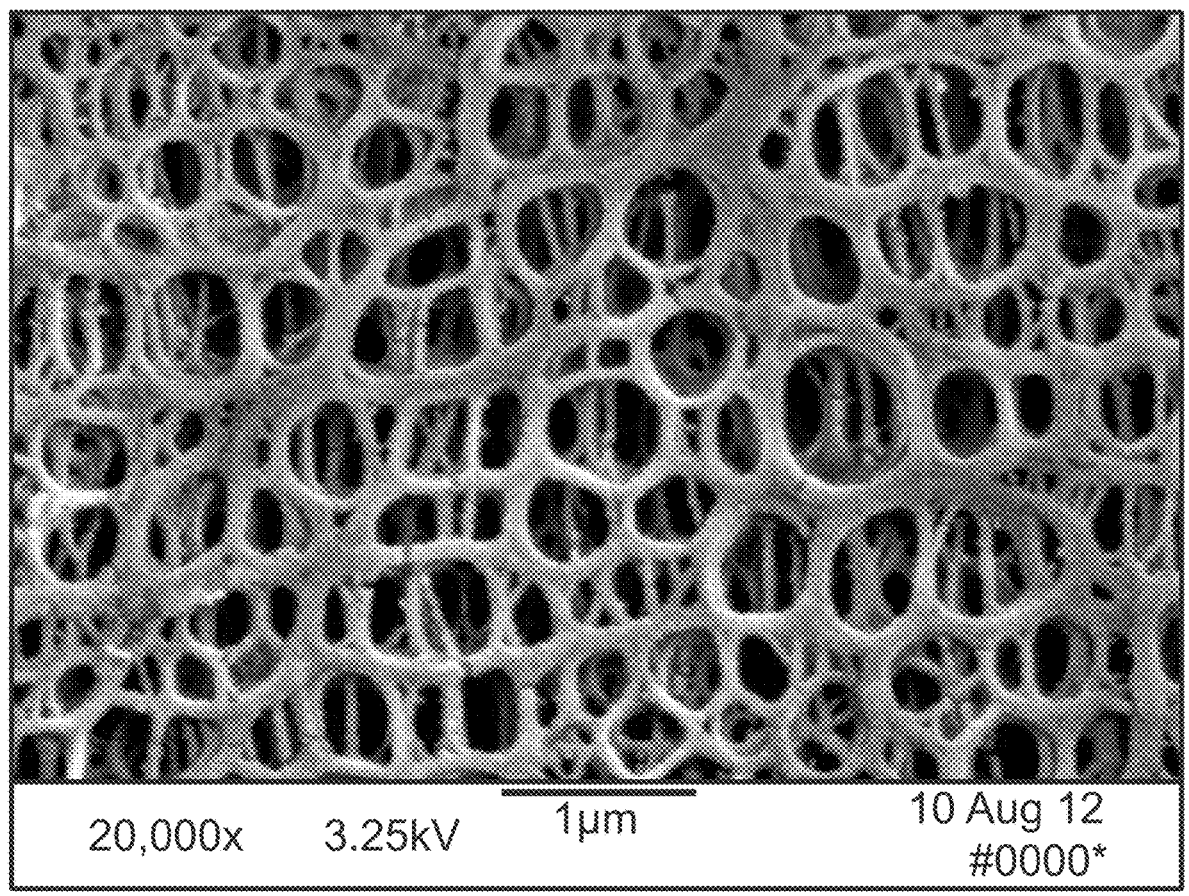
FIG. 9 is a surface SEM image of the metalized surface of the metalized membrane or material of FIG. 5 at 20,000× magnification.
Figure 10A:
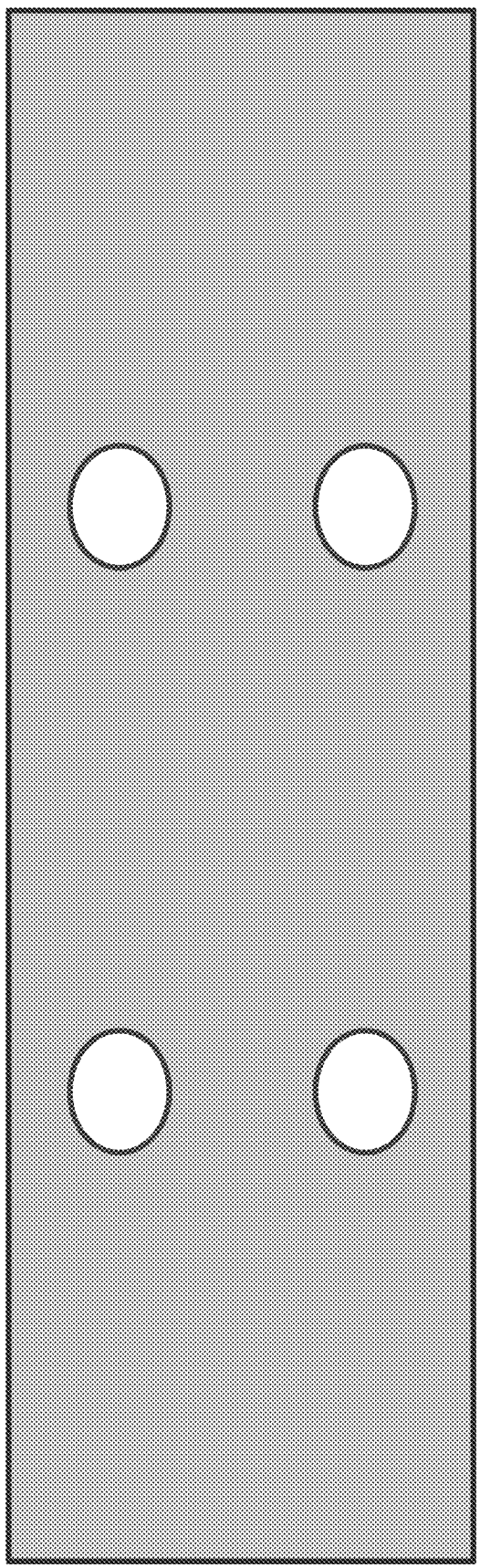
FIG. 10 includes (A) a top view and (B) a cross-sectional view of a bare membrane before coating in accordance with embodiments described herein; the membrane is opaque and white (or blue) in appearance because of its porosity and is electrically insulating.
Figure 10B:
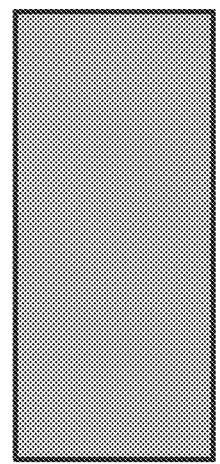
Figure 10B:
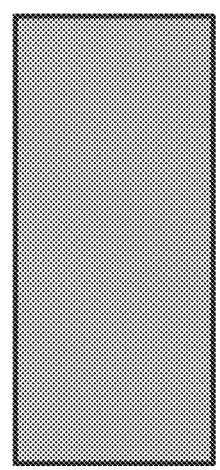
Figure 10B:
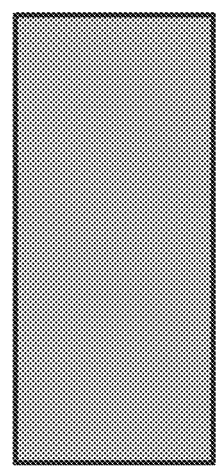
Figure 11A:
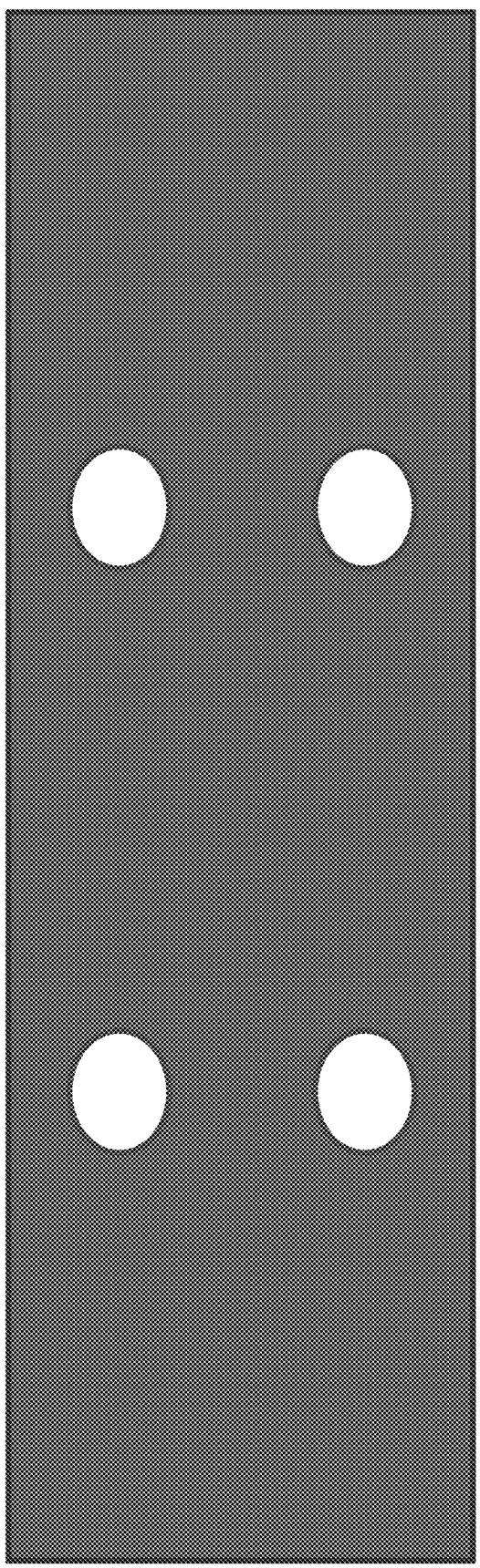
FIG. 11 includes (A) a top view and (B) a cross-sectional view of the membrane of FIG. 10 after one surface has been coated with an electrically conductive coating (such coating is red in FIG. 11); the membrane appears opaque and shiny (reflective) because of the combination of the membrane's porosity and the electrically conductive coating and is now electrically conductive on the metalized surface.
Figure 11B:
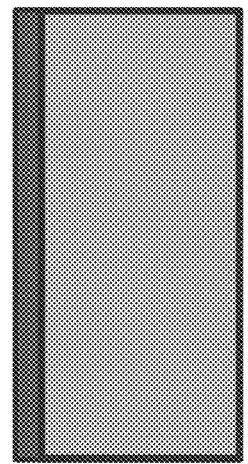
Figure 11B:
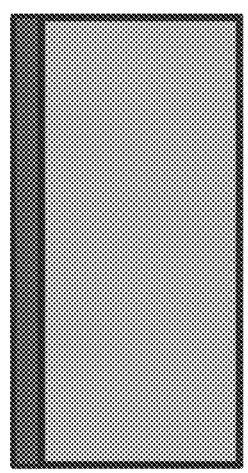
Figure 12A:
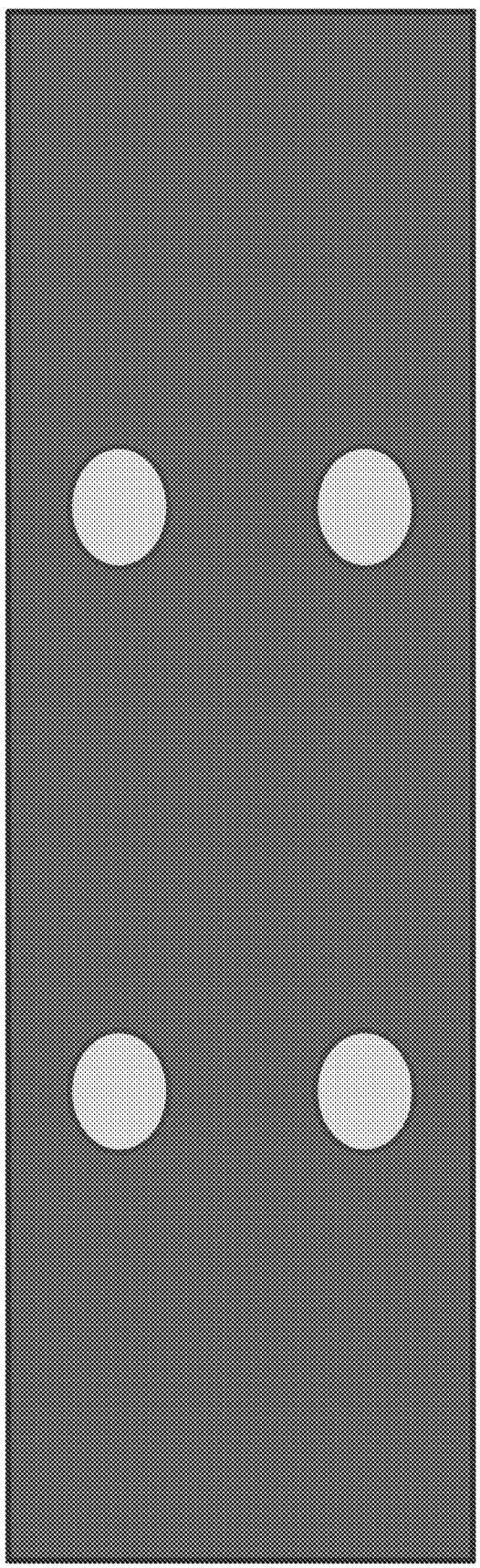
FIG. 12 includes (A) a top view and (B) a cross-sectional view of the membrane of FIG. 11 after the pores have been filled (such filler is green in FIG. 12); the membrane appears transparent and/or translucent because the pores are filled and is still electrically conductive due to the electrically conductive coating (red in FIG. 12).
Figure 12B:
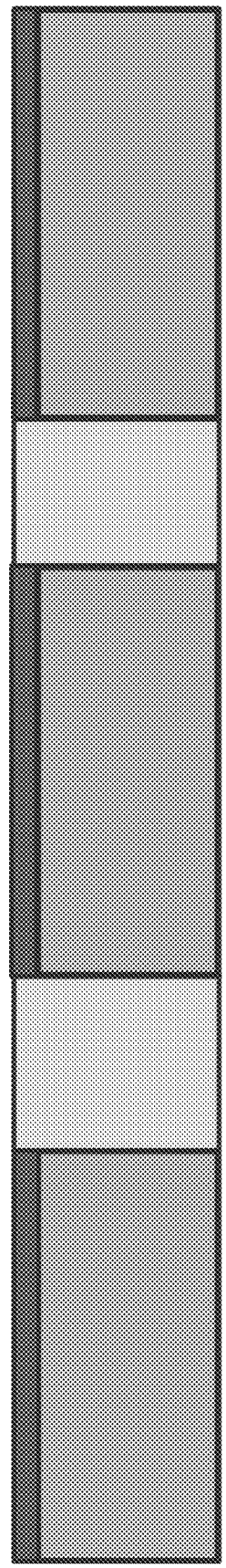
Figure 13A:
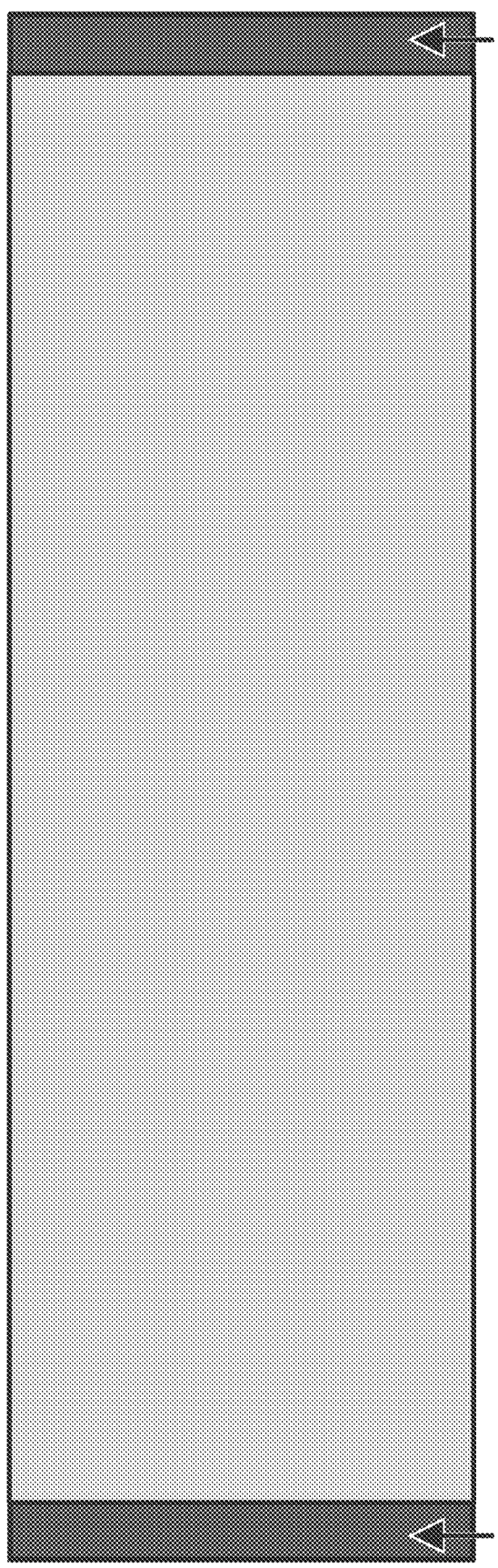
FIG. 13 includes (A) a top view and (B) a cross-sectional view of the membrane of FIG. 12 after the pores have been over-filled with the same filler depicted in FIG. 12 (such filler is green in FIG. 13); the membrane appears transparent and/or translucent because of the filler in the pores. Areas 1 and 2 remain electrically conductive because of the electrically conductive coating.
Figure 13B:
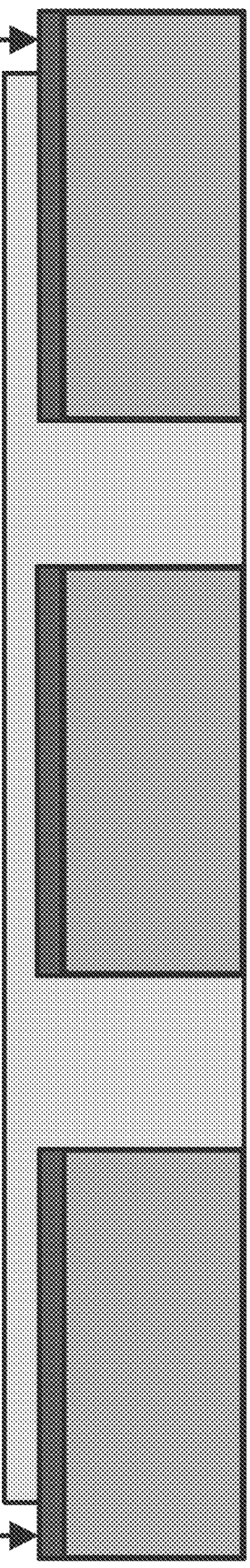

FIG. 9 is a surface SEM of the metalized surface of the metalized membrane or material of FIG. 5 at 20,000× magnification. The aluminum flakes are barely visible on the fibrils.

In accordance with at least selected embodiments, objects, or aspects, the present invention may address the need for or provide microporous membranes suitable for electrically conductive applications and/or applications involving high temperature, oxidative, and/or other corrosive environments, and/or relates to conductive, transparent, translucent, partially reflective, and/or reflective polymeric membranes or materials, substrates for such membranes or materials, methods of production of such substrates, membranes and/or materials, and/or methods of use of such substrates, membranes and/or materials. In accordance with at least selected embodiments, the present invention relates to electrically conductive membranes or materials, preferably electrically conductive transparent or semi-transparent membranes or materials, new or improved porous or microporous substrates for such membranes, methods of production of such conductive membranes or materials, and/or methods of use of such membranes, materials or substrates.

Various embodiments of the invention have been described in fulfillment of the various objects of the invention. It should be recognized that these embodiments are merely illustrative of the principles of the present invention. Numerous modifications and adaptations thereof will be readily apparent to those skilled in the art without departing from the spirit and scope of the invention.

That which is claimed is:

1. A transparent or translucent membrane comprising:
   a microporous polymeric matrix having an interconnected pore structure and an index of refraction, wherein the polymeric matrix comprises multiple layers of polymeric material; and
   a filler material fills the pore structure of the polymeric matrix, the filler material having an index of refraction substantially matching the index of refraction of the polymeric matrix, wherein substantially matching means the filler material has an index of refraction that is +/−0.1 relative to the index of refraction of the polymeric matrix.

2. The membrane of claim 1 wherein the filler material is one of a solid or an adhesive.

3. The membrane of claim 1 wherein the membrane is transparent.

4. The membrane of claim 1 wherein the membrane is translucent.

5. The membrane of claim 1 wherein the microporous polymeric matrix is formed of one or more polyolefins, polyamides, polyesters, polysulfones, celluloses, fluoropolymers, and combinations or blends thereof.

6. The membrane of claim 1 wherein the microporous polymeric matrix is formed of one or more polyolefins selected from the group consisting of polyethylene, polypropylene, and combinations, copolymers and blends thereof.

7. The membrane of claim 1 wherein individual layers of the polymeric matrix are selected from the group consisting of polyethylene, polypropylene, and combinations, copolymers and blends thereof.

8. The membrane of claim 1 having a thickness of 1 μm to 100 μm and the thickness including an optional metalized, conductive or reflective coating or deposition over one or more surfaces of the microporous polymeric matrix.

9. The membrane of claim 1 having a thickness of 5 μto 20 μm.

10. A metalized, conductive or reflective composite membrane comprising:
    a microporous polymeric matrix having an interconnected pore structure, wherein the polymeric matrix comprises multiple layers of polymeric material: and
    a metalized, conductive or reflective coating or deposition over one or more surfaces of the microporous polymeric matrix.

11. The composite membrane of claim 10 further-comprising filler material in the pore structure of the polymeric matrix, the filler material having an index of refraction substantially matching an index of refraction of the polymeric matrix.

12. The composite membrane of claim 11 wherein the filler material is one of a solid or an adhesive.

13. The composite membrane of claim 10 wherein the membrane is transparent or translucent.

14. The composite membrane of claim 10 wherein the microporous polymeric matrix is formed of one or more polyolefins, polyamides, polyesters, polysulfones, celluloses, fluoropolymers, and combinations, mixtures or blends thereof.

15. The composite membrane of claim 14 wherein the one or more polyolefins are selected from the group consisting of polyethylene, polypropylene, and copolymers, mixtures, and blends thereof.

16. The composite membrane of claim 10 wherein individual layers of the polymeric matrix is selected from the group consisting of polyethylene, polypropylene, and copolymers, mixtures, and blends thereof.

17. The composite membrane of claim 10 having a thickness of 1 µm to 100 µm and the composite membrane optionally adapted to serve as a battery separator.

18. The composite membrane of claim 10 having a thickness of 5 µm to 20 µm.

19. The composite membrane of claim 10 wherein the conductive coating or deposition comprises an electrically conductive coating or deposition of at least one metal or alloy.

20. The composite membrane of claim 10 wherein the membrane is flexible.

21. The composite membrane of claim 10 having sheet resistance of 1-500 Ω/sq.

22. A touchscreen device comprising:
 a display; and
 the composite membrane of claim 10.

23. A method of making the composite membrane of claim 10 comprising the steps of:
 providing a microporous polymeric matrix having an interconnected pore structure and an index of refraction; and
 adding a metalized, conductive or reflective coating or deposition over one or more surfaces of the microporous polymeric matrix.

24. The method of claim 23 wherein in the adding step an electrically conductive coating or deposition is patterned over one or more surfaces of the microporous polymeric matrix.

* * * * *